US012203959B2

(12) United States Patent
Schindler et al.

(10) Patent No.: US 12,203,959 B2
(45) Date of Patent: Jan. 21, 2025

(54) METHODS OF ESTABLISHING CONTACT BETWEEN A PROBE TIP OF A PROBE SYSTEM AND A DEVICE UNDER TEST, PROBE SYSTEMS THAT PERFORM THE METHODS, AND STORAGE MEDIA THAT DIRECTS PROBE SYSTEMS TO PERFORM THE METHODS

(71) Applicant: FormFactor, Inc., Livermore, CA (US)

(72) Inventors: Martin Schindler, Saxony (DE); Felix Krug, Freital (DE)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 18/510,290

(22) Filed: Nov. 15, 2023

(65) Prior Publication Data

US 2024/0168058 A1    May 23, 2024

Related U.S. Application Data

(60) Provisional application No. 63/426,636, filed on Nov. 18, 2022.

(51) Int. Cl.
    *G01R 1/067*      (2006.01)
(52) U.S. Cl.
    CPC ................... *G01R 1/06794* (2013.01)
(58) Field of Classification Search
    CPC .................................................. G01R 1/06794
    See application file for complete search history.

(56) References Cited

U.S. PATENT DOCUMENTS

| | | |
|---|---|---|
| 3,996,517 A | 12/1976 | Fergason et al. |
| 4,864,227 A | 9/1989 | Sato |
| 4,992,659 A | 2/1991 | Abraham et al. |
| 5,091,692 A | 2/1992 | Ohno et al. |
| 5,237,267 A | 8/1993 | Harwood et al. |
| 5,243,665 A | 9/1993 | Maney et al. |
| 5,394,100 A | 2/1995 | Bohler et al. |
| 5,416,592 A | 5/1995 | Mori et al. |

(Continued)

FOREIGN PATENT DOCUMENTS

| | | |
|---|---|---|
| DE | 102004030881 A1 | 4/2005 |
| JP | 405121498 A | 5/1993 |

(Continued)

*Primary Examiner* — Paresh Patel
(74) *Attorney, Agent, or Firm* — KOLITCH ROMANO DASCENZO GATES LLC

(57) ABSTRACT

Methods of establishing contact between a probe tip of a probe system and a device under test, probe systems that perform the methods, and storage media that directs probe systems to perform the methods. The methods include measuring a height differential between a DUT surface of the DUT and an auxiliary surface of an auxiliary chuck and aligning the probe tip and the auxiliary chuck for contact with one another. The methods also include physically contacting the probe tip with the auxiliary surface to determine an auxiliary contact height between the probe tip and the auxiliary surface and determining a DUT contact height between the probe tip and the DUT surface. The methods further include aligning the probe tip and the DUT for contact with one another and moving the probe tip to the DUT contact height to physically contact the probe tip with the DUT surface.

20 Claims, 5 Drawing Sheets

(56) References Cited

U.S. PATENT DOCUMENTS

| | | | |
|---|---|---|---|
| 5,644,245 A | 7/1997 | Saitoh et al. | |
| 5,657,394 A | 8/1997 | Schwartz et al. | |
| 5,742,395 A | 4/1998 | Biedermann et al. | |
| 5,917,332 A | 6/1999 | Chen et al. | |
| 6,002,426 A | 12/1999 | Back et al. | |
| 6,096,567 A | 8/2000 | Kaplan et al. | |
| 6,255,827 B1 | 7/2001 | Farooq et al. | |
| 6,356,093 B2 | 3/2002 | Nishikawa et al. | |
| 6,473,987 B1 * | 11/2002 | Steere, III | G01B 5/06 33/549 |
| 7,057,408 B2 | 6/2006 | Schneidewind et al. | |
| 7,733,108 B2 | 6/2010 | Kanev et al. | |
| 8,072,586 B2 | 12/2011 | Teich et al. | |
| 8,094,925 B2 | 1/2012 | Schneidewind et al. | |
| 9,110,131 B2 | 8/2015 | Dietrich et al. | |
| 10,330,703 B2 | 6/2019 | Beng et al. | |
| 2002/0011835 A1 | 1/2002 | Yamazaki | |
| 2003/0142862 A1 | 7/2003 | Snow et al. | |
| 2005/0278056 A1 | 12/2005 | Farnworth et al. | |
| 2006/0097743 A1 * | 5/2006 | Komatsu | G01R 31/2891 324/750.17 |
| 2006/0184041 A1 | 8/2006 | Andrews et al. | |
| 2007/0001707 A1 * | 1/2007 | Bohm | G01R 31/2808 324/754.1 |
| 2007/0159194 A1 | 7/2007 | Hasegawa et al. | |
| 2008/0088833 A1 | 4/2008 | Yokota et al. | |
| 2008/0158664 A1 | 7/2008 | Teich et al. | |
| 2008/0315903 A1 | 12/2008 | Schmidt et al. | |
| 2009/0085594 A1 | 4/2009 | Yamamoto et al. | |
| 2009/0219046 A1 | 9/2009 | Yamada et al. | |
| 2010/0045313 A1 | 2/2010 | Sleijpen et al. | |
| 2013/0113509 A1 | 5/2013 | Wu et al. | |
| 2014/0253162 A1 | 9/2014 | Wang et al. | |
| 2019/0025342 A1 | 1/2019 | Mori et al. | |
| 2019/0227102 A1 * | 7/2019 | Frankel | G01R 1/06727 |
| 2020/0217638 A1 | 7/2020 | Negishi et al. | |
| 2021/0333322 A1 | 10/2021 | Kanev et al. | |
| 2021/0382108 A1 | 12/2021 | Kanev et al. | |
| 2022/0236303 A1 | 7/2022 | Schindler et al. | |

FOREIGN PATENT DOCUMENTS

| | | |
|---|---|---|
| JP | H11248800 A | 9/1999 |
| TW | 201245731 A1 | 11/2012 |
| TW | I730851 B | 6/2021 |
| TW | 202142873 A | 10/2021 |

* cited by examiner

METHODS OF ESTABLISHING CONTACT BETWEEN A PROBE TIP OF A PROBE SYSTEM AND A DEVICE UNDER TEST, PROBE SYSTEMS THAT PERFORM THE METHODS, AND STORAGE MEDIA THAT DIRECTS PROBE SYSTEMS TO PERFORM THE METHODS

RELATED APPLICATION

This application claims priority to U.S. Provisional Patent Application Ser. No. 63/426,636, which was filed on Nov. 18, 2022, and the complete disclosure of which is hereby incorporated by reference.

FIELD OF THE DISCLOSURE

The present disclosure relates generally to methods of establishing contact between a probe tip of a probe system and a device under test, to probe systems that perform the methods, and to storage media that directs probe systems to perform the methods.

BACKGROUND OF THE DISCLOSURE

Probe systems may be utilized to test, or to electrically test, a device under test (DUT), such as an integrated circuit device, an electrical device, an optical device, and/or an optoelectronic device. In some probe systems, it may be desirable to establish contact, such as physical contact and/or electrical contact, between the DUT and a probe tip of a probe of the probe system. As an example, contact between the probe tip and the DUT may permit and/or facilitate transfer of electrical signals between the probe system and the DUT, such as to test and/or quantify operation and/or performance of the DUT.

Conventional probe systems often include a vision system that permits and/or facilitates observation, such as visual observation, of the probe and/or of the DUT. Such conventional probe systems may utilize this observation to determine if and/or when the probe tip is in contact with the DUT. While effective in certain circumstances, this observation may be ineffective for small probes. In addition, it may be difficult to design a robust algorithm for automatically establishing contact between the probe tip and the DUT utilizing the vision system, especially when the probes are small and/or when debris accumulates near and/or on the probes. Thus, there exists a need for improved methods of establishing contact between a probe tip of a probe of a probe system and a device under test, for probe systems that perform the methods, and/or for storage media that directs probe systems to perform the methods.

SUMMARY OF THE DISCLOSURE

Methods of establishing contact between a probe tip of a probe system and a device under test, probe systems that perform the methods, and storage media that directs probe systems to perform the methods. The methods include measuring a height differential between a DUT surface of the DUT and an auxiliary surface of an auxiliary chuck and aligning the probe tip and the auxiliary chuck for contact with one another. The methods also include physically contacting the probe tip with the auxiliary surface of the auxiliary chuck to determine an auxiliary contact height between the probe tip and the auxiliary surface, and the methods further include determining a DUT contact height between the probe tip and the DUT surface. The DUT contact height is based, at least in part, on the height differential and the auxiliary contact height. The methods further include aligning the probe tip and the DUT for contact with one another and moving the probe tip to the DUT contact height to physically contact the probe tip with the DUT surface. The measuring, aligning, physically contacting, determining, and/or moving may include utilizing a positioning structure of the probe system.

DETAILED DESCRIPTION AND BEST MODE OF THE DISCLOSURE

Figure 1:
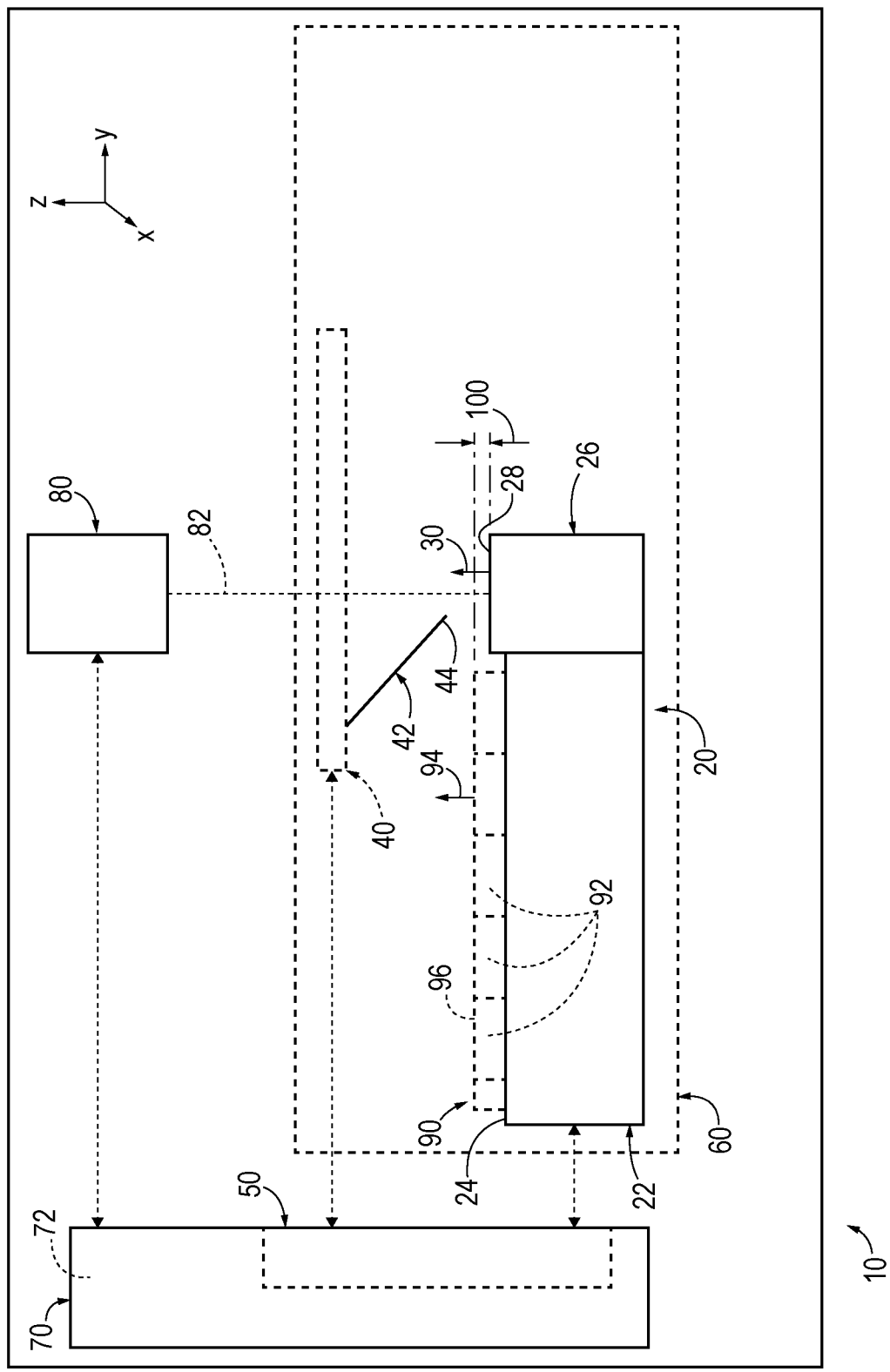
FIG. 1 is a schematic illustration of examples of a probe system that may be configured to perform methods, according to the present disclosure.

FIGS. 1-5 provide examples of probe systems 10, of non-transitory computer-readable storage media 72, and/or of methods 200, according to the present disclosure. Elements that serve a similar, or at least substantially similar, purpose are labeled with like numbers in each of FIGS. 1-5, and these elements may not be discussed in detail herein with reference to each of FIGS. 1-5. Similarly, all elements may not be labeled in each of FIGS. 1-5, but reference numerals associated therewith may be utilized herein for consistency. Elements, components, and/or features that are discussed herein with reference to one or more of FIGS. 1-5 may be included in and/or utilized with any of FIGS. 1-5 without departing from the scope of the present disclosure.

In general, elements that are likely to be included in a particular embodiment are illustrated in solid lines, while elements that are optional may be illustrated in dashed lines. However, elements that are shown in solid lines may not be essential to all embodiments and, in some embodiments, may be omitted without departing from the scope of the present disclosure.

FIGS. 1-4 are schematic illustrations of examples of probe system 10, which may be configured to perform methods 200, according to the present disclosure. As illustrated in FIGS. 1-4, probe systems 10 include a chuck assembly 20, a probe 42, a signal generation and analysis assembly 50, a positioning structure 60, a controller 70, and a vision system 80.

Chuck assembly 20 includes a primary chuck 22, which defines a support surface 24. Support surface 24 is configured to support, or to physically support, a substrate 90 that includes a device under test (DUT) 92. Examples of primary chuck 22 include a thermal chuck, a temperature-controlled chuck, and/or a vacuum chuck. Examples of substrate 90 include a wafer, a semiconductor wafer, a silicon wafer, and/or a Group III-V semiconductor wafer. Examples of DUT 92 include an electrical device, a semiconductor device, an integrated circuit device, an optical device, and/or an optoelectronic device.

Chuck assembly 20 also includes an auxiliary chuck 26, which defines an auxiliary surface 28. Auxiliary chuck 26 may be laterally spaced apart from primary chuck 22, such as in a direction that is parallel to a plane of support surface 24 and/or of auxiliary surface 28. Additionally or alternatively, auxiliary chuck 26 may be operatively attached to primary chuck 22 and/or may be configured for motion with primary chuck 22, such as discussed in more detail herein.

Probe 42 includes a probe tip 44. Probe tip 44 is configured to contact, such as to physically contact and/or to electrically contact, DUT 92, such as to permit and/or facilitate testing operation of DUT 92. Examples of probe 42 include an electrical probe, a needle probe, and/or a cantilever probe. In some examples, probe 42 may form a portion of a probe assembly 40, which also may be referred to herein as a probe card 40 that may be configured to electrically test DUT 92. In some examples, probe assembly 40 may include a plurality of probes 42, with each probe 42 being configured to contact, or to simultaneously contact, a corresponding region of a DUT surface 96 of DUT 92.

As discussed in more detail herein, auxiliary chuck 26 may be configured to permit and/or to facilitate detection of contact with probe tip 44 of probe 42. As an example, auxiliary chuck 26, or at least a region of auxiliary chuck 26 that defines auxiliary surface 28, may be electrically conductive and/or may be configured to detect electrical continuity with probe tip 44. As another example, auxiliary chuck 26, or at least the region of auxiliary chuck 26 that defines auxiliary surface 28, may be pressure sensitive and/or may be configured to detect a contact force, or a contact pressure, applied by probe tip 44 upon contact with auxiliary surface 28.

Figure 3:
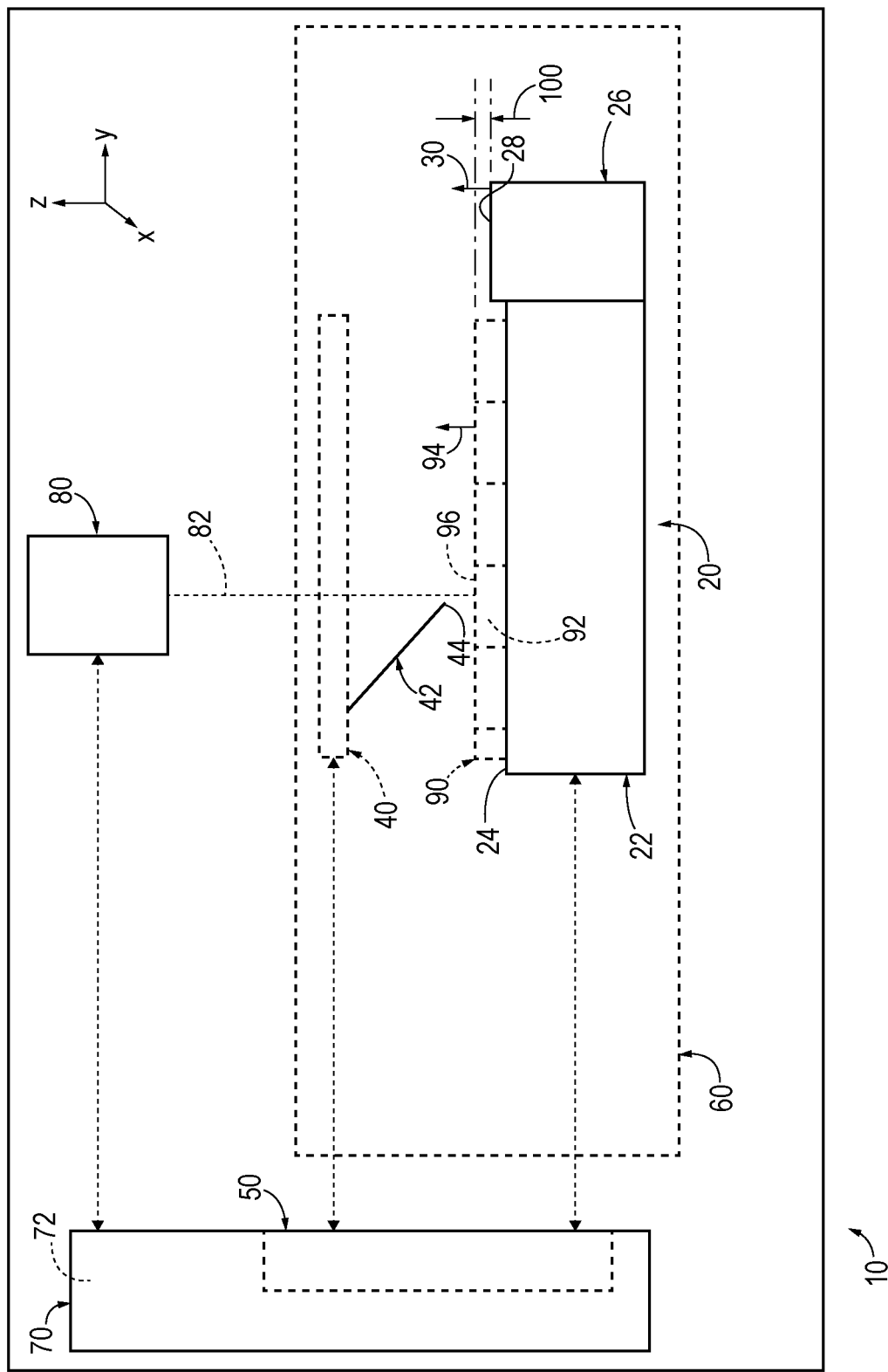
FIG. 3 is a schematic illustration of examples of a probe system that may be configured to perform methods, according to the present disclosure.
Figure 4:
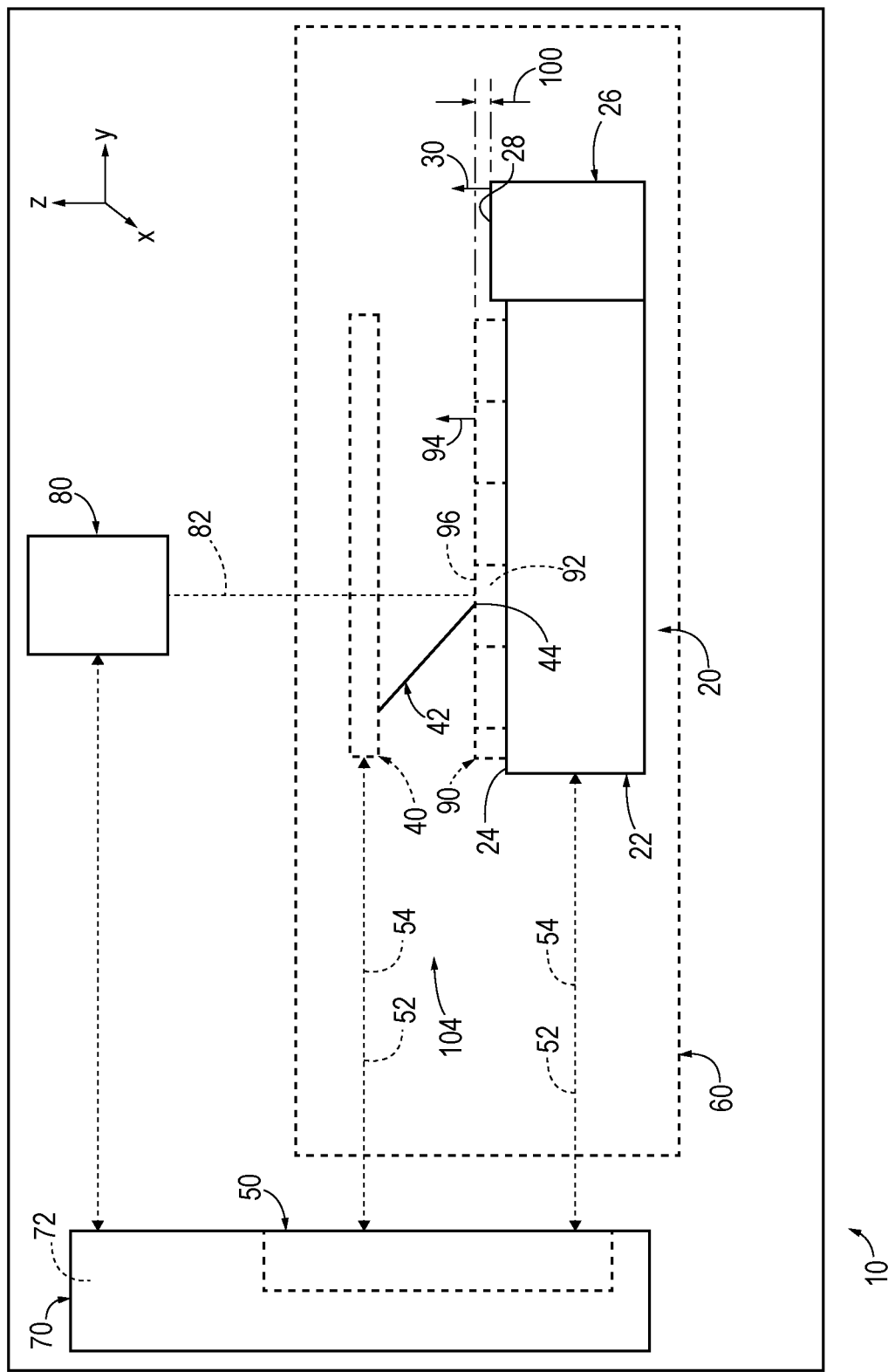
FIG. 4 is a schematic illustration of examples of a probe system that may be configured to perform methods, according to the present disclosure.

As illustrated in FIG. 4, signal generation and analysis assembly 50 may be configured to supply a test signal 52 to DUT 92 and/or to receive a resultant signal 54 from DUT 92. Test signal 52 and/or resultant signal 54 may include and/or be electrical signals, which may be conveyed to and/or from DUT 92 via probe tip 44, such as during contact between DUT 92 and probe tip 44. Examples of signal generation and analysis assembly 50 include an electric signal generator, a function generator, an optical signal generator, an electric signal analyzer, and/or an optical signal analyzer. Signal generation and analysis assembly 50 may form a portion of and/or may be included in controller 70. Alternatively, and as illustrated in dashed lines in FIGS. 1-4, the signal generation and analysis assembly may be separate and/or distinct from controller 70. Positioning structure 60 may be configured to selectively vary a relative orientation between probe tip 44 and chuck assembly 20 and is illustrated in dashed lines in FIGS. 1-4 to indicate that the positioning structure may be operatively attached to, may be configured to translate, and/or may be configured to rotate chuck assembly 20, probe 42, and/or probe assembly 40 that includes probe 42. As an example, positioning structure 60 may be configured to translate chuck assembly 20, probe 42, and/or probe assembly 40 along a plurality of distinct, perpendicular, and/or orthogonal actuation axes. In a specific example, positioning structure 60 may be configured to translate chuck assembly 20, probe 42, and/or probe assembly 40 along an X-actuation axis, which may be parallel to the X-axis illustrated in FIGS. 1-4, a Y-actuation axis, which may be parallel to the Y-axis illustrated in FIGS. 1-4, and/or a Z-actuation axis, which may be parallel to the Z-axis illustrated in FIGS. 1-4. Additionally or alternatively, positioning structure 60 may be configured to rotate chuck assembly 20, probe 42, and/or probe assembly 40 about the X-axis, about the Y-axis, and/or about the Z-axis.

Examples of positioning structure 60 include a linear actuator, a rotary actuator, a mechanical actuator, an electrical actuator, a rack and pinion assembly, a lead screw and nut assembly, a ball screw and nut assembly, a linear motor, a stepper motor, a servo motor, and/or a piezoelectric actuator.

Figure 2:
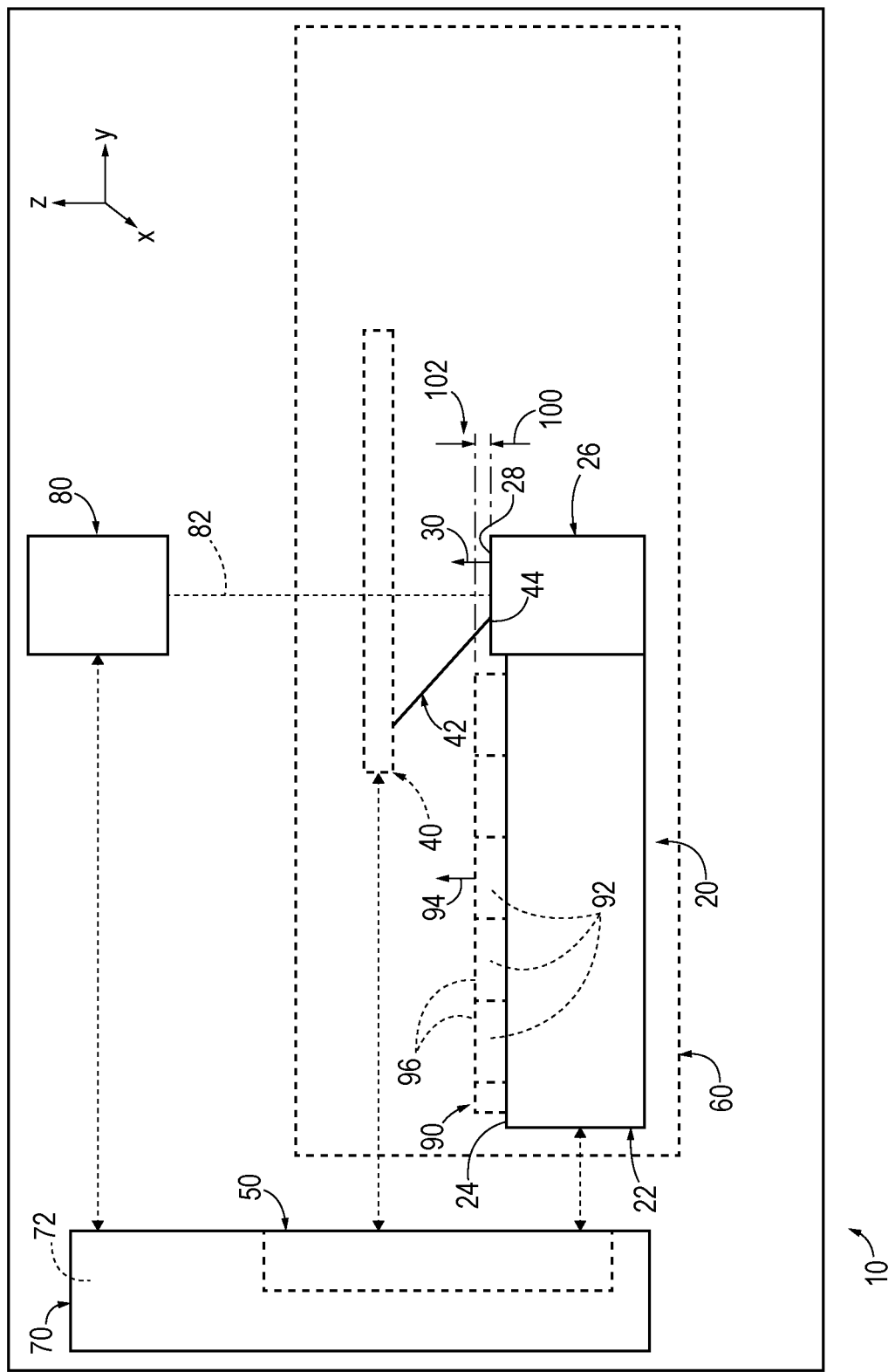
FIG. 2 is a schematic illustration of examples of a probe system that may be configured to perform methods, according to the present disclosure.

Vision system 80 may be configured to collect an optical image of at least a region of probe system 10. This may include collection of the optical image along an optical axis 82, which may extend perpendicular, or at least substantially perpendicular, to support surface 24 and/or to auxiliary surface 28 and/or may extend parallel, or at least substantially parallel, to a DUT surface normal direction 94 of DUT 92 and/or to an auxiliary surface normal direction 30 of auxiliary surface 28. Vision system 80 may be configured to collect the optical image of any suitable region of probe system 10. As an example, and as illustrated in FIGS. 1-2, vision system 80 may be configured to collect the optical image of and/or above auxiliary surface 28. As another example, and as illustrated in FIGS. 3-4, vision system 80 may be configured to collect the optical image of and/or above DUT surface 96 of DUT 92. Vision system 80 may include and/or be a downward-looking vision system 80. Examples of vision system 80 include a microscope, a lens, a camera, a still camera, a video camera, and/or a digital camera.

Controller 70 is programmed to control the operation of probe system 10. This may include controlling the operation of probe system 10 according to, or by causing the probe system to perform, any suitable step and/or steps of methods 200, which are discussed in more detail herein.

As an example, during operation of probe systems 10, and as discussed in more detail herein, controller 70 may cause probe system 10 to measure a height differential 100 between DUT surface 96 and auxiliary surface 28. As a more specific example, controller 70 may cause vision system 80 to focus on DUT surface 96, as illustrated in FIG. 3, and also on auxiliary surface 28, as illustrated in FIG. 1. Controller 70 then may determine height differential 100 from a focal height difference between DUT surface 96 and auxiliary surface 28.

It is within the scope of the present disclosure that an orientation and/or a position of primary chuck 22 relative to auxiliary chuck 26 and/or of support surface 24 relative to auxiliary surface 28 may be fixed, or at least substantially fixed, at least while probe system 10 performs methods 200 and/or tests a given DUT 92 on a given substrate 90. As such, height differential 100 may be a constant during testing of the given DUT on the given substrate, thereby permitting and/or facilitating subsequent determination of the DUT contact height by controller 70, as discussed in more detail herein.

In addition, controller 70 may cause positioning structure 60 to align probe tip 44 and auxiliary chuck 26 for contact with one another. This may include moving probe tip 44 relative to auxiliary chuck 26 and/or moving auxiliary chuck 26 relative to probe tip 44, such as to the configuration that is illustrated in FIG. 1.

Subsequently, controller 70 may cause positioning structure 60 to physically contact probe tip 44 with auxiliary surface 28 of auxiliary chuck 26 and determine an auxiliary contact height 102 at which the probe tip contacts the auxiliary surface, as illustrated in FIG. 2. As an example, the auxiliary contact height may include, may be, and/or may be associated with a position along the Z-actuation axis of positioning structure 60 at which the probe contacts the auxiliary surface.

Controller 70 then may determine a DUT contact height 104 for contact between probe tip 44 and DUT surface 96 of DUT 92, as illustrated in FIG. 4. As an example, controller 70 may calculate the DUT contact height from height differential 100 and auxiliary contact height 102. As a more specific example, controller 70 may adjust the auxiliary contact height, with the height differential, to determine the DUT contact height.

Controller 70 then may cause positioning structure 60 to align probe tip 44 and DUT 92 for contact with one another, such as may be illustrated by the transition from the configuration that is illustrated in FIG. 1 to the configuration that is illustrated in FIG. 3. This may include moving probe tip 44 relative to DUT 92 and/or moving DUT 92 relative to probe tip 44.

Controller 70 subsequently may cause positioning structure 60 to move probe tip 44 to DUT contact height 104, as illustrated in FIG. 4. This may cause probe tip 44 to contact, or to physically contact, DUT surface 96, thereby permitting and/or facilitating testing of DUT 92 by probe system 10.

Methods 200 and/or probe systems 10, which include controllers 70 that perform methods 200, may provide a number of benefits over conventional probe systems. As an example, utilization of auxiliary surface 28 to determine auxiliary contact height 102 may permit and/or facilitate subsequent determination of DUT contact height 104 without the need to experimentally determine the DUT contact height during contact between probe tip 44 and DUT 92. Such a configuration may decrease a potential for damage to DUT 92 during the contacting process and/or may permit and/or facilitate improved, more accurate, and/or more precise control of contact forces between probe tip 44 and DUT 92.

As another example, methods 200 may permit and/or facilitate establishing contact, or physical contact, between probe tip 44 and DUT 92 without utilizing an image of probe 42. Such a configuration may be especially beneficial for small probe tips that cannot readily be imaged and/or focused on by vision system 80, thereby permitting probe system 10 to operate with small probes 42 that may not be readily utilized to contact a corresponding DUT within conventional probe systems.

Controller 70 may include and/or be any suitable structure, device, and/or devices that may be adapted, configured, designed, constructed, and/or programmed to perform the functions discussed herein. As examples, controller 70 may include one or more of an electronic controller, a dedicated controller, a special-purpose controller, a personal computer, a special-purpose computer, a display device, a logic device, a memory device, and/or a memory device having computer-readable storage media 72.

The computer-readable storage media, when present, also may be referred to herein as non-transitory computer readable storage media. This non-transitory computer readable storage media may include, define, house, and/or store computer-executable instructions, programs, and/or code; and these computer-executable instructions may direct probe systems 10 and/or controller 70 thereof to perform any suitable portion, or subset, of methods 200. Examples of such non-transitory computer-readable storage media include CD-ROMs, disks, hard drives, flash memory, etc. As used herein, storage, or memory, devices and/or media having computer-executable instructions, as well as computer-implemented methods and other methods according to the present disclosure, are considered to be within the scope of subject matter deemed patentable in accordance with Section 101 of Title 35 of the United States Code.

Figure 5:
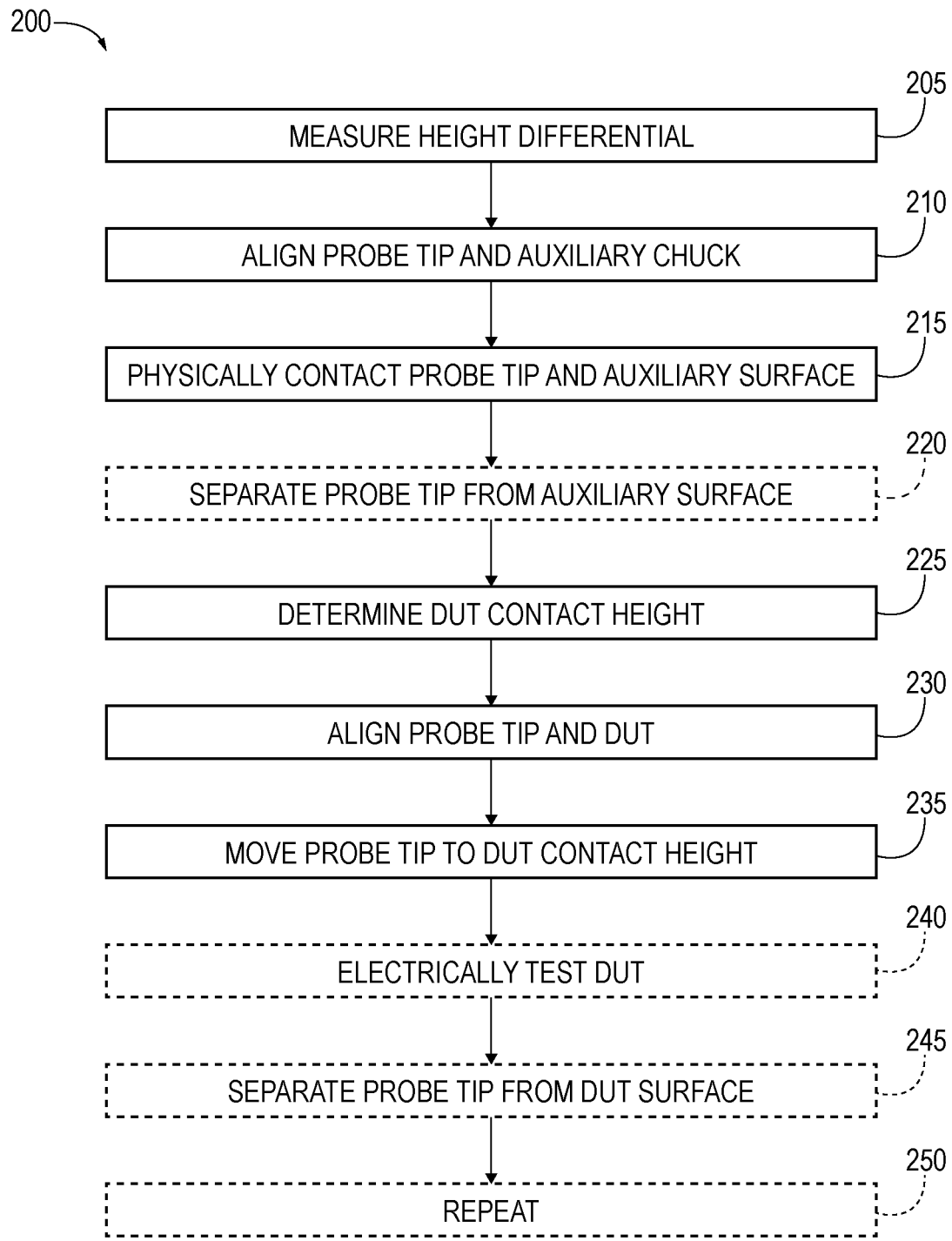
FIG. 5 is a flowchart depicting examples of methods of establishing contact between a probe tip of a probe and a device under test, according to the present disclosure.

FIG. 5 is a flowchart depicting examples of methods 200 of establishing contact between a probe tip of a probe system and a device under test (DUT), according to the present disclosure. The DUT may be formed, defined, and/or fabricated on a substrate that is supported by a support surface of a primary chuck of the probe system. Examples of the probe tip are disclosed herein with reference to probe tip 44. Examples of the probe system are disclosed herein with reference to probe system 10. Examples of the DUT are disclosed herein with reference to DUT 92. Examples of the substrate are disclosed herein with reference to substrate 90. Examples of the primary chuck are disclosed herein with reference to primary chuck 22. Examples of the support surface are disclosed herein with reference to support surface 24.

Methods 200 include measuring a height differential at 205, aligning the probe tip and an auxiliary chuck at 210, and physically contacting the probe tip with an auxiliary surface at 215. Methods 200 may include separating the probe tip from the auxiliary surface at 220, and methods 200 include determining a DUT contact height at 225, aligning the probe tip and the DUT at 230, and moving the probe tip to the DUT contact height at 235. Methods 200 also may include electrically testing the DUT at 240, separating the probe tip from the DUT surface at 245, and/or repeating the methods at 250.

Measuring the height differential at 205 may include measuring the height differential between a DUT surface of the DUT and an auxiliary surface of an auxiliary chuck. Examples of the DUT surface are disclosed herein with reference to DUT surface 96. Examples of the auxiliary surface are disclosed herein with reference to auxiliary surface 28. Examples of the auxiliary chuck are disclosed herein with reference to auxiliary chuck 26. As illustrated in FIGS. 1-4, auxiliary surface 28 and DUT surface 96 may extend parallel, or at least substantially parallel, to one another.

The measuring at 205 may be performed in any suitable manner. As an example, the measuring at 205 may include measuring a height of the DUT surface and also measuring a height of the auxiliary surface. In such an example, the height differential may include and/or be a difference, or an absolute value of the difference, between the height of the DUT surface and the height of the auxiliary surface.

As another example, the measuring at 205 may be performed with, via, and/or utilizing a vision system of the probe system, such as vision system 80 of FIGS. 1-4. In such an example, the measuring at 205 may include focusing the vision system on the DUT surface to determine a DUT surface focal position of the vision system, or a position at which the DUT surface is in focus to the vision system, as illustrated in FIG. 3. The measuring at 205 also may include focusing the vision system on the auxiliary surface to determine an auxiliary surface focal position of the vision system, or a position at which the auxiliary surface is in focus to the vision system, as illustrated in FIG. 1. In such an example, the height differential may be based, at least in part, on the DUT surface focal position and the auxiliary surface focal position. As examples, the measuring at 205 may include calculating the height differential based, at least in part, on the DUT surface focal position and the auxiliary surface focal position, calculating the height differential from a linear combination of the DUT surface focal position and the auxiliary surface focal position, and/or calculating the height differential as a difference, or an absolute value of the difference, between the DUT surface focal position and the auxiliary surface focal position.

It is within the scope of the present disclosure that the measuring at 205 may include measuring the height differential to a height differential resolution. Examples of the height differential resolution include resolutions of at most 5 micrometers, at most 4 micrometers, at most 3 micrometers, at most 2 micrometers, at most 1 micrometer, at most 0.5 micrometers, or at most 0.25 micrometers.

The height differential may be measured in any suitable direction and/or dimension. As an example, the height differential may be measured along a DUT surface normal direction of the DUT surface, such as DUT surface normal direction 94 of FIGS. 1-4. As another example, the height differential may be measured along an auxiliary surface normal direction of the auxiliary surface, such as auxiliary surface normal direction 30 of FIGS. 1-4. As yet another example, the height differential may be measured along an optical axis of the vision system, such as optical axis 82 of FIGS. 1-4. As another example, the height differential may be measured along a Z-actuation axis of a positioning structure of the probe system, examples of which are disclosed herein.

The measuring at 205 may be performed with any suitable timing and/or sequence during methods 200. As examples, the measuring at 205 may be performed prior to, at least partially concurrently with, and/or subsequent to the aligning at 210, the physically contacting at 215, and/or the separating at 220. As additional examples, the measuring at 205 may be performed prior to the determining at 225, the aligning at 230, the moving at 235, the electrically testing at 240, and/or the separating at 245.

Aligning the probe tip and the auxiliary chuck at 210 may include aligning the probe tip and the auxiliary chuck for contact with one another, and the aligning the probe tip and the auxiliary chuck at 210 may be performed utilizing a positioning structure of the probe system. Examples of the positioning structure are disclosed herein with reference to positioning structure 60.

As discussed, the positioning structure may be configured to move and/or to translate the probe tip, the auxiliary chuck, and/or a chuck assembly that includes the auxiliary chuck in three orthogonal, or at least substantially orthogonal, directions and/or along three orthogonal, or at least substantially orthogonal, actuation axes, such as an X-actuation axis, a Y-actuation axis, and a Z-actuation axis. In such a configuration, the X-actuation axis and the Y-actuation axis may extend parallel, or at least substantially parallel, to the auxiliary surface, to the support surface, and/or to the substrate surface, while the Z-actuation axis may extend perpendicular, or at least substantially perpendicular, to the auxiliary surface, to the support surface, and/or to the substrate surface.

The aligning at 210 may be accomplished in any suitable manner. As examples, the aligning at 210 may include positioning the probe tip vertically above the auxiliary surface, positioning the probe tip within a plane that is parallel, or at least substantially parallel, to the auxiliary surface, positioning the probe tip such that a surface normal vector from the auxiliary surface intersects the probe tip, and/or positioning the probe tip within an X-Y plane defined by the X-actuation axis of the positioning structure and the Y-actuation axis of the positioning structure.

The aligning at 210 may be performed with any suitable timing and/or sequence during methods 200. As examples, the aligning at 210 may be performed prior to, at least partially concurrently with, and/or subsequent to the measuring at 205. As additional examples, the aligning at 210 may be performed prior to the physically contacting at 215, the separating at 220, the determining at 225, the aligning at 230, the moving at 235, the electrically testing at 240, and/or the separating at 245.

Physically contacting the probe tip with the auxiliary surface at 215 may include establishing contact, direct contact, electrical contact, and/or physical contact between, or directly between, the probe tip and the auxiliary surface of the auxiliary chuck. The physically contacting at 215 may be performed with, via, and/or utilizing the positioning structure. Additionally or alternatively, the physically contacting at 215 may be performed to determine and/or to establish an auxiliary contact height between the probe tip and the auxiliary surface. Examples of the auxiliary contact height are disclosed herein with reference to auxiliary contact height 102.

The physically contacting at 215 may be accomplished in any suitable manner. As examples, the physically contacting at 215 may include moving the probe tip toward the auxiliary surface, moving the probe tip along the auxiliary surface normal direction of the auxiliary surface, moving the probe tip along the Z-actuation axis of the positioning structure, moving the auxiliary surface toward the probe tip, moving the auxiliary surface along the auxiliary surface normal direction, and/or moving the auxiliary surface along the Z-actuation axis of the positioning structure.

The physically contacting at 215 may include detecting contact between the probe tip and the auxiliary surface. The detecting may be accomplished in any suitable manner. As examples, the detecting contact may include detecting electrical continuity between the probe tip and the auxiliary surface, detecting a probe contact force exerted on the auxiliary surface by the probe tip, and/or detecting a surface contact force exerted on the probe tip by the auxiliary surface.

As a more specific example, the probe tip and the auxiliary surface may be electrically conductive and/or may be configured to complete an electrical circuit upon contact therebetween. In such an example, the detecting contact may include detecting completion of the electrical circuit, such as via any suitable voltage detector, current detector, and/or electrical continuity detector. As another example, the auxiliary surface may be pressure-sensitive and/or may be configured to detect the probe contact force. As yet another example, the probe tip may be pressure-sensitive and/or may be configured to detect the surface contact force.

The auxiliary contact height may be defined in any suitable manner. As an example, the auxiliary contact height may include and/or be an orientation of the positioning structure, along the Z-actuation axis, at which the probe tip establishes, or initially establishes, contact with the auxiliary surface. As another example, the auxiliary contact height may include a small, a predetermined, and/or a defined amount of overtravel of the probe tip toward the auxiliary surface, such as may be needed to facilitate detection of the contact between the probe tip and the auxiliary surface.

It is within the scope of the present disclosure that the physically contacting at 215 may include determining the auxiliary contact height to an auxiliary contact height resolution. Examples of the auxiliary contact height resolution include resolutions of at most 5 micrometers, at most 4 micrometers, at most 3 micrometers, at most 2 micrometers, at most 1 micrometer, at most 0.5 micrometers, or at most 0.25 micrometers.

The physically contacting at 215 may be performed with any suitable timing and/or sequence during methods 200. As examples, the physically contacting at 215 may be performed prior to, at least partially concurrently with, and/or subsequent to the measuring at 205. As another example, the physically contacting at 215 may be performed subsequent to the aligning at 210. As additional examples, the physically contacting at 215 may be performed prior to the separating at 220, the determining at 225, the aligning at 230, the moving at 235, the electrically testing at 240, and/or the separating at 245.

Separating the probe tip from the auxiliary surface at 220 may include forming, defining, and/or establishing a spaced-apart relationship between the probe tip and the auxiliary surface. This may include moving and/or translating the probe tip and the auxiliary surface away from one another, such as along the auxiliary surface normal direction. As examples, the separating at 220 may include moving the probe tip away from the auxiliary surface, moving the probe tip along the auxiliary surface normal direction of the auxiliary surface, moving the probe tip along the Z-actuation axis of the positioning structure, moving the auxiliary surface away from the probe tip, moving the auxiliary surface along the auxiliary surface normal direction, and/or moving the auxiliary surface along the Z-actuation axis of the positioning structure.

It is within the scope of the present disclosure that the separating at 220 may include establishing a probe tip-auxiliary surface separation distance. Examples of the probe tip-auxiliary surface separation distance include distances of at least 2 micrometers, at least 4 micrometers, at least 6 micrometers, at least 8 micrometers, at least 10 micrometers, at least 15 micrometers, at least 20 micrometers, at least 30 micrometers, at least 40 micrometers, at least 50 micrometers, at most 100 micrometers, at most 80 micrometers, at most 60 micrometers, at most 40 micrometers, and/or at most 20 micrometers.

The separating at 220 may be performed with any suitable timing and/or sequence during methods 200. As examples, the separating at 220 may be performed prior to, at least partially concurrently with, and/or subsequent to the measuring at 205. As additional examples, the separating at 220 may be performed subsequent to the aligning at 210 and/or the physically contacting at 215. As further examples, the separating at 220 may be performed prior to the determining at 225, the aligning at 230, the moving at 235, the electrically testing at 240, and/or the separating at 245.

Determining the DUT contact height at 225 may include determining the DUT contact height as a contact height between the probe tip and the DUT surface. The DUT contact height and/or the determining at 225 may be based, at least in part, on the height differential, as measured during the measuring at 205, and the auxiliary contact height, as determined during the physically contacting at 215.

The determining at 225 may be accomplished in any suitable manner. As an example, the determining at 225 may include calculating a relative height, along the Z-actuation axis of the positioning structure, at which the probe tip contacts the DUT surface during the moving at 235. As more specific examples, the determining at 225 may include calculating the DUT contact height based, at least in part, on the height differential and the auxiliary contact height and/or calculating the DUT contact height from a linear combination of the height differential and the auxiliary contact height. As yet another example, the determining at 225 may include adjusting the auxiliary contact height based upon the height differential.

It is within the scope of the present disclosure that the determining at 225 may include determining the DUT contact height to a DUT contact height resolution. Examples of the DUT contact height resolution include resolutions of at most 5 micrometers, at most 4 micrometers, at most 3 micrometers, at most 2 micrometers, at most 1 micrometer, at most 0.5 micrometers, or at most 0.25 micrometers.

The determining at 225 may be performed with any suitable timing and/or sequence during methods 200. As examples, the determining at 225 may be performed subsequent to the measuring at 205, the aligning at 210, and/or the physically contacting at 215. As additional examples, the determining at 225 may be performed at least partially concurrently with and/or subsequent to the separating at 220. As further examples, the determining at 225 may be performed prior to and/or at least partially concurrently with the aligning at 230. As additional examples, the determining at 225 may be performed prior to the moving at 235, the electrically testing at 240, and/or the separating at 245.

Aligning the probe tip and the DUT at 230 may include aligning the probe tip and the DUT for contact with one another and may be performed utilizing the positioning structure. As discussed, the positioning structure may be configured to move and/or to translate the probe tip, the chuck, and/or the chuck assembly in three orthogonal, or at least substantially orthogonal, directions and/or along three orthogonal, or at least substantially orthogonal, actuation axes, such as the X-actuation axis, the Y-actuation axis, and the Z-actuation axis.

The aligning at 230 may be accomplished in any suitable manner. As examples, the aligning at 230 may include positioning the probe tip vertically above the DUT surface, positioning the probe tip within a plane that is parallel, or at least substantially parallel, to the DUT surface, positioning the probe tip such that a surface normal vector from the DUT surface intersects the probe tip, and/or positioning the probe tip within an X-Y plane defined by the X-actuation axis of the positioning structure and the Y-actuation axis of the positioning structure.

The aligning at 230 may be performed with any suitable timing and/or sequence during methods 200. As examples, the aligning at 230 may be performed at least partially concurrently with and/or subsequent to the measuring at 205. As additional examples, the aligning at 230 may be performed subsequent to the aligning at 210, the physically contacting at 215, and/or the separating at 220. As further examples, the aligning at 230 may be performed prior to, at least partially concurrently with, and/or subsequent to the determining at 225. As additional examples, the aligning at 230 may be performed prior to the moving at 235, the electrically testing at 240, and/or the separating at 245.

Moving the probe tip to the DUT contact height at 235 may include establishing contact, such as direct contact, electrical contact, and/or physical contact, between, or directly between, the probe tip and the DUT surface of the DUT. The moving at 235 may be performed via and/or utilizing the positioning structure and may be accomplished in any suitable manner. As examples, the moving at 235 may include moving the probe tip toward the DUT surface, moving the probe tip along the DUT surface normal direction, moving the probe tip along the Z-actuation axis of the positioning structure, moving the DUT surface toward the probe tip, moving the DUT surface along the DUT surface normal direction, and/or moving the DUT surface along the Z-actuation axis.

In some examples, the determining at 225 may include determining the DUT contact height based, at least in part, on a desired overtravel magnitude. As an example, the DUT contact height may be decreased by the desired overtravel magnitude such that the moving at 235 provides the desired overtravel magnitude. In some examples, and when the physically contacting at 215 includes the small, the predetermined, and/or the defined amount of overtravel of the probe tip toward the auxiliary surface, the desired overtravel magnitude may correspond to, or equal, this defined amount of overtravel and may be included in the auxiliary contact height that is determined during the physically contacting at 215.

It is within the scope of the present disclosure that, subsequent to, or subsequent to completion of, the moving at 235, the probe tip may exhibit and/or exert less than a threshold overtravel magnitude. Examples of the threshold overtravel magnitude include overtravel magnitudes of less than 10 micrometers, less than 8 micrometers, less than 6 micrometers, less than 5 micrometers, less than 4 micrometers, less than 3 micrometers, less than 2 micrometers, or less than 1 micrometer.

Such small overtravel magnitudes, or additional motion of the probe and the DUT toward one another after initial contact between the probe tip and the DUT surface, may be permitted and/or facilitated by the accuracy of methods 200 in determining the DUT contact height. In addition, such small overtravel magnitudes may be less than what may be achievable, readily achievable, and/or reproducibly achievable utilizing conventional probe systems that do not perform methods 200. As such, methods 200 may permit and/or facilitate decreased overtravel and/or decreased contact forces between the probe tip and the DUT when compared to the conventional probe systems.

Methods 200 additionally or alternatively may permit and/or facilitate performing the moving at 235 and/or establishing the contact between the probe tip and the DUT without utilizing an image, or an optical image, of the probe and/or of the probe tip. As discussed in more detail herein, it may be difficult, or even impossible, to accurately determine the position of the probe tip utilizing the vision system of the probe system, for small probes. As such, methods 200 may permit and/or enable reliable contact between the DUT surface and the probe tip for probes that otherwise may be too small to be utilized within conventional probe systems.

The moving at 235 may be performed with any suitable timing and/or sequence during methods 200. As examples, the moving at 235 may be performed subsequent to the measuring at 205, the aligning at 210, the physically contacting at 215, the separating at 220, and/or the aligning at 230. As additional examples, the moving at 235 may be performed at least partially concurrently with and/or subsequent to the determining at 225. As further examples, the moving at 235 may be performed prior to the electrically testing at 240, and/or the separating at 245.

Electrically testing the DUT at 240 may include performing any suitable electrical test with and/or on the DUT in any suitable manner. As an example, the electrically testing at 240 may include providing at least one electric test signal to the DUT, such as via the probe tip. As another example, the electrically testing at 240 may include receiving at least one resultant signal from the DUT, such as via the probe tip. As yet another example, the electrically testing at 240 may include utilizing a signal generation and analysis assembly of the probe system, examples of which are disclosed herein with reference to signal generation and analysis assembly 50.

The electrically testing at 240 may be performed with any suitable timing and/or sequence during methods 200. As examples, the electrically testing at 240 may be performed subsequent to the measuring at 205, the aligning at 210, the physically contacting at 215, the separating at 220, the determining at 225, the aligning at 230, and/or the moving at 235. As another example, the electrically testing at 240 may be performed prior to the separating at 245.

Separating the probe tip from the DUT surface at 245 may include forming, defining, and/or establishing a spaced-apart relationship between the probe tip and the DUT surface. This may include moving and/or translating the probe tip and the DUT surface away from one another, such as along the DUT surface normal direction. As examples, the separating at 245 may include moving the probe tip away from the DUT surface, moving the probe tip along the DUT surface normal direction, moving the probe tip along the Z-actuation axis of the positioning structure, moving the DUT surface away from the probe tip, moving the DUT surface along the DUT surface normal direction, and/or moving the DUT surface along the Z-actuation axis of the positioning structure.

It is within the scope of the present disclosure that the separating at 245 may include establishing a probe tip-DUT surface separation distance. Examples of the probe tip-DUT surface separation distance include distances of at least 2 micrometers, at least 4 micrometers, at least 6 micrometers, at least 8 micrometers, at least 10 micrometers, at least 15 micrometers, at least 20 micrometers, at least 30 micrometers, at least 40 micrometers, at least 50 micrometers, at most 100 micrometers, at most 80 micrometers, at most 60 micrometers, at most 40 micrometers, and/or at most 20 micrometers.

The separating at 245 may be performed with any suitable timing and/or sequence during methods 200. As examples, the separating at 245 may be performed subsequent to the measuring at 205, the aligning at 210, the physically contacting at 215, the separating at 220, the determining at 225, the aligning at 230, the moving at 235, and/or the electrically testing at 240.

In some examples, the substrate may include a plurality of DUTs, and an upper surface of the substrate, such as may be defined by a plurality of DUT surfaces of the plurality of DUTs, may not be planar, may not be entirely planar, may not be parallel to the auxiliary surface, and/or may not be entirely parallel to the auxiliary surface. Stated differently, a DUT contact height for one DUT of the plurality of DUTs may differ from a DUT contact height for another DUT of the plurality of DUTs.

With this in mind, repeating the methods at 250 may include repeating the methods to permit and/or to facilitate performing the moving at 235 and/or the electrically testing at 240 for each DUT in the plurality of DUTs, or at least within a contacted subset of the plurality of DUTs. Examples of the contacted subset of the plurality of DUTs include more than one DUT, at least 10% of a total number of DUTs in the plurality of DUTs, at least 25% of the total number of DUTs, at least 75% of the total number of DUTs, or all DUTs in the plurality of DUTs.

As an example, the repeating at 250 may include repeating the measuring at 205 for each DUT in the contacted subset of the plurality of DUTs to determine a corresponding height differential for each DUT in the contacted subset. As another example, the repeating at 250 may include repeating the determining at 225 for each DUT in the contacted subset to determine a corresponding DUT contact height for each DUT in the contacted subset. This may include utilizing the height differential, or the same height differential, as determined during the physically contacting at 215, to perform the determining at 225 for each DUT in the contacted subset of the plurality of DUTs. As yet another example, the repeating at 250 may include sequentially repeating the aligning at 230 and the moving at 235 for each DUT in the contacted subset of the plurality of DUTs to physically contact the probe tip with a corresponding DUT surface of each DUT in the contacted subset of the plurality of DUTs. In some such examples, the sequentially repeating further may include, subsequent to the moving at 235, sequentially repeating the electrically testing at 240 for each DUT in the contacted subset of the plurality of DUTs.

In other examples where the substrate includes the plurality of DUTs, the upper surface of the substrate may be sufficiently planar and/or may be sufficiently parallel to the auxiliary surface to permit and/or facilitate performing the repeating at 250 without, or without the need to, repeat the measuring at 205 for each DUT in the contacted subset of the plurality of DUTs. In such examples, the repeating at 250 may include repeating, or sequentially repeating, the aligning at 230, the moving at 235, and/or the electrically testing at 240 for each DUT in the contacted subset of the plurality of DUTs.

In the present disclosure, several of the illustrative, non-exclusive examples have been discussed and/or presented in the context of flow diagrams, or flow charts, in which the methods are shown and described as a series of blocks, or steps. Unless specifically set forth in the accompanying description, it is within the scope of the present disclosure that the order of the blocks may vary from the illustrated order in the flow diagram, including with two or more of the blocks (or steps) occurring in a different order and/or concurrently. It is also within the scope of the present disclosure that the blocks, or steps, may be implemented as logic, which also may be described as implementing the blocks, or steps, as logics. In some applications, the blocks, or steps, may represent expressions and/or actions to be performed by functionally equivalent circuits or other logic devices. The illustrated blocks may, but are not required to, represent executable instructions that cause a computer, processor, and/or other logic device to respond, to perform an action, to change states, to generate an output or display, and/or to make decisions.

As used herein, the term "and/or" placed between a first entity and a second entity means one of (1) the first entity, (2) the second entity, and (3) the first entity and the second entity. Multiple entities listed with "and/or" should be construed in the same manner, i.e., "one or more" of the entities so conjoined. Other entities may optionally be present other than the entities specifically identified by the "and/or" clause, whether related or unrelated to those entities specifically identified. Thus, as a non-limiting example, a reference to "A and/or B," when used in conjunction with open-ended language such as "comprising" may refer, in one embodiment, to A only (optionally including entities other than B); in another embodiment, to B only (optionally including entities other than A); in yet another embodiment, to both A and B (optionally including other entities). These entities may refer to elements, actions, structures, steps, operations, values, and the like.

As used herein, the phrase "at least one," in reference to a list of one or more entities should be understood to mean at least one entity selected from any one or more of the entities in the list of entities, but not necessarily including at least one of each and every entity specifically listed within the list of entities and not excluding any combinations of entities in the list of entities. This definition also allows that entities may optionally be present other than the entities specifically identified within the list of entities to which the phrase "at least one" refers, whether related or unrelated to those entities specifically identified. Thus, as a non-limiting example, "at least one of A and B" (or, equivalently, "at least one of A or B," or, equivalently "at least one of A and/or B") may refer, in one embodiment, to at least one, optionally including more than one, A, with no B present (and optionally including entities other than B); in another embodiment, to at least one, optionally including more than one, B, with no A present (and optionally including entities other than A); in yet another embodiment, to at least one, optionally including more than one, A, and at least one, optionally including more than one, B (and optionally including other entities). In other words, the phrases "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C," and "A, B, and/or C" may mean A alone, B alone, C alone, A and B together, A and C together, B and C together, A, B, and C together, and optionally any of the above in combination with at least one other entity.

In the event that any patents, patent applications, or other references are incorporated by reference herein and (1) define a term in a manner that is inconsistent with and/or (2) are otherwise inconsistent with, either the non-incorporated portion of the present disclosure or any of the other incorporated references, the non-incorporated portion of the present disclosure shall control, and the term or incorporated disclosure therein shall only control with respect to the reference in which the term is defined and/or the incorporated disclosure was present originally.

As used herein the terms "adapted" and "configured" mean that the element, component, or other subject matter is designed and/or intended to perform a given function. Thus, the use of the terms "adapted" and "configured" should not be construed to mean that a given element, component, or other subject matter is simply "capable of" performing a given function but that the element, component, and/or other subject matter is specifically selected, created, implemented, utilized, programmed, and/or designed for the purpose of performing the function. It is also within the scope of the present disclosure that elements, components, and/or other recited subject matter that is recited as being adapted to perform a particular function may additionally or alternatively be described as being configured to perform that function, and vice versa.

As used herein, the phrase, "for example," the phrase, "as an example," and/or simply the term "example," when used with reference to one or more components, features, details, structures, embodiments, and/or methods according to the present disclosure, are intended to convey that the described component, feature, detail, structure, embodiment, and/or method is an illustrative, non-exclusive example of components, features, details, structures, embodiments, and/or methods according to the present disclosure. Thus, the described component, feature, detail, structure, embodiment, and/or method is not intended to be limiting, required, or exclusive/exhaustive; and other components, features, details, structures, embodiments, and/or methods, including structurally and/or functionally similar and/or equivalent components, features, details, structures, embodiments, and/or methods, are also within the scope of the present disclosure.

As used herein, "at least substantially," when modifying a degree or relationship, may include not only the recited "substantial" degree or relationship, but also the full extent of the recited degree or relationship. A substantial amount of a recited degree or relationship may include at least 75% of the recited degree or relationship. For example, an object that is at least substantially formed from a material includes objects for which at least 75% of the objects are formed from the material and also includes objects that are completely formed from the material. As another example, a first length that is at least substantially as long as a second length includes first lengths that are within 75% of the second length and also includes first lengths that are as long as the second length.

Additionally or alternatively, the phrase "at least substantially," when utilized to describe a directional relationship, means that the described component(s) are within a threshold angular variation of the given directional relationship. As an example, the phrase "at least substantially orthogonal" means that three components are within the threshold angular variation of being orthogonal to one another. As another example, the phrase "at least substantially parallel" means that two or more components are within the threshold angular variation of being parallel to one another. As another example, the phrase "at least substantially perpendicular" means that two or more components are within the threshold angular variation of being perpendicular to one another. As another example, the phrase "at least substantially normal" means that one or more components is within the threshold angular variation of being normal to one or more other components. As another example, the phrase "at least substantially vertical" means that one or more components is within the threshold angular variation of being vertical. As another example, the phrase "at least substantially horizontal" means that one or more components is within the threshold angular variation of being horizontal. Examples of the threshold angular variation include angular variations of at most 5 degrees, at most 4 degrees, at most 3 degrees, at most 2 degrees, at most 1 degree, at most 0.5 degrees, or at most 0.25 degrees.

Illustrative, non-exclusive examples of probe systems, storage media, and methods according to the present disclosure are presented in the following enumerated paragraphs. It is within the scope of the present disclosure that an individual step of a method recited herein, including in the following enumerated paragraphs, may additionally or alternatively be referred to as a "step for" performing the recited action.

A1. A method of establishing contact between a probe tip of a probe system and a device under test (DUT), optionally wherein the DUT is formed on a substrate that is supported by a support surface of a primary chuck of the probe system, the method comprising:
  measuring a height differential between a DUT surface of the DUT and an auxiliary surface of an auxiliary chuck;
  aligning the probe tip and the auxiliary chuck for contact with one another utilizing a positioning structure of the probe system;
  physically contacting the probe tip with the auxiliary surface of the auxiliary chuck, utilizing the positioning structure, to determine an auxiliary contact height between the probe tip and the auxiliary surface;
  determining a DUT contact height between the probe tip and the DUT surface, wherein the DUT contact height is based, at least in part, on the height differential and the auxiliary contact height;
  aligning the probe tip and the DUT for contact with one another utilizing the positioning structure; and
  moving the probe tip to the DUT contact height, utilizing the positioning structure, to physically contact the probe tip with the DUT surface.

A2. The method of paragraph A1, wherein the measuring the height differential includes measuring a height of the DUT surface and a height of the auxiliary surface.

A3. The method of any of paragraphs A1-A2, wherein the measuring the height differential includes:
  (i) focusing a vision system of the probe system on the DUT surface to determine a DUT surface focal position of the vision system; and
  (ii) focusing the vision system on the auxiliary surface to determine an auxiliary surface focal position of the vision system.

A4. The method of paragraph A3, wherein the measuring the height differential further includes at least one of:
  (i) calculating the height differential based, at least in part, on the DUT surface focal position and the auxiliary surface focal position; and
  (ii) calculating the height differential from a linear combination of the DUT surface focal position and the auxiliary surface focal position.

A5. The method of any of paragraphs A1-A4, wherein the measuring the height differential includes measuring the height differential to a height differential resolution of at most 5 micrometers, at most 4 micrometers, at most 3 micrometers, at most 2 micrometers, at most 1 micrometer, at most 0.5 micrometers, or at most 0.25 micrometers.

A6. The method of any of paragraphs A1-A5, wherein the measuring the height differential includes measuring the height differential at least one of:
  (i) along a DUT surface normal direction of the DUT surface;
  (ii) along an auxiliary surface normal direction of the auxiliary surface; and
  (iii) along a Z-actuation axis of the positioning structure.

A7. The method of any of paragraphs A1-A6, wherein the aligning the probe tip and the auxiliary chuck for contact with one another includes at least one of:
  (i) positioning the probe tip vertically above the auxiliary surface;
  (ii) positioning the probe tip within a plane that is parallel, or at least substantially parallel, to the auxiliary surface;
  (iii) positioning the probe tip such that a surface normal vector from the auxiliary surface intersects the probe tip, and
  (iv) positioning the probe tip within an X-Y plane defined by an X-actuation axis of the positioning structure and a Y-actuation axis of the positioning structure.

A8. The method of any of paragraphs A1-A7, wherein the aligning the probe tip and the DUT with one another includes at least one of:
  (i) positioning the probe tip vertically above the DUT surface;
  (ii) positioning the probe tip within a plane that is parallel, or at least substantially parallel, to the DUT surface;
  (iii) positioning the probe tip such that a surface normal vector from the DUT surface intersects the probe tip; and
  (iv) positioning the probe tip within an/the X-Y plane defined by an/the X-actuation axis of the positioning structure and a/the Y-actuation axis of the positioning structure.

A9. The method of any of paragraphs A1-A8, wherein the physically contacting the probe tip with the auxiliary surface of the auxiliary chuck includes at least one of:
  (i) moving the probe tip toward the auxiliary surface;
  (ii) moving the probe tip along an/the auxiliary surface normal direction of the auxiliary surface;

(iii) moving the probe tip along a/the Z-actuation axis of the positioning structure;
(iv) moving the auxiliary surface toward the probe tip;
(v) moving the auxiliary surface along the auxiliary surface normal direction; and
(vi) moving the auxiliary surface along the Z-actuation axis of the positioning structure.

A10. The method of any of paragraphs A1-A9, wherein the physically contacting includes detecting contact between the probe tip and the auxiliary surface.

A11. The method of any of paragraphs A1-A10, wherein the detecting contact includes at least one of:
(i) detecting electrical continuity between the probe tip and the auxiliary surface;
(ii) detecting a probe contact force exerted on the auxiliary surface by the probe tip; and
(iii) detecting a surface contact force exerted on the probe tip by the auxiliary surface.

A12. The method of any of paragraphs A1-A11, wherein the auxiliary contact height includes, or is, an orientation of the positioning structure, along a/the Z-actuation axis of the positioning structure, at which the probe tip initially establishes contact with the auxiliary surface.

A13. The method of any of paragraphs A1-A12, wherein the physically contacting includes determining the auxiliary contact height to an auxiliary contact height resolution of at most 5 micrometers, at most 4 micrometers, at most 3 micrometers, at most 2 micrometers, at most 1 micrometer, at most 0.5 micrometers, or at most 0.25 micrometers.

A14. The method of any of paragraphs A1-A13, wherein the determining the DUT contact height includes calculating a relative height, along the Z-actuation axis of the positioning structure, at which the probe tip contacts the DUT surface during the moving the probe tip to the DUT contact height.

A15. The method of any of paragraphs A1-A14, wherein the determining the DUT contact height includes at least one of:
(i) calculating the DUT contact height based, at least in part, on the height differential and the auxiliary contact height; and
(ii) calculating the DUT contact height from a linear combination of the height differential and the auxiliary contact height.

A16. The method of any of paragraphs A1-A15, wherein the determining the DUT contact height includes adjusting the auxiliary contact height based upon the height differential.

A17. The method of any of paragraphs A1-A16, wherein the determining the DUT contact height includes determining the DUT contact height to a DUT contact height resolution of at most 5 micrometers, at most 4 micrometers, at most 3 micrometers, at most 2 micrometers, at most 1 micrometer, at most 0.5 micrometers, or at most 0.25 micrometers.

A18. The method of any of paragraphs A1-A17, wherein the moving the probe tip to the DUT contact height includes at least one of:
(i) moving the probe tip toward the DUT surface;
(ii) moving the probe tip along a/the DUT surface normal direction of the DUT surface;
(iii) moving the probe tip along a/the Z-actuation axis of the positioning structure;
(iv) moving the DUT surface toward the probe tip;
(v) moving the DUT surface along the DUT surface normal direction; and
(vi) moving the DUT surface along the Z-actuation axis of the positioning structure.

A19. The method of any of paragraphs A1-A18, wherein, subsequent to the moving the probe tip to the DUT contact height, the probe tip exhibits less than a threshold overtravel magnitude, optionally wherein the threshold overtravel magnitude is less than 10 micrometers, less than 8 micrometers, less than 6 micrometers, less than 5 micrometers, less than 4 micrometers, less than 3 micrometers, less than 2 micrometers, or less than 1 micrometer.

A20. The method of any of paragraphs A1-A19, wherein, subsequent to the physically contacting the probe tip with the auxiliary surface and prior to the aligning the probe tip and the DUT for contact with one another, the method further includes separating the probe tip from the auxiliary surface.

A21. The method of paragraph A20, wherein the separating the probe tip from the auxiliary surface includes at least one of:
(i) moving the probe tip away from the auxiliary surface;
(ii) moving the probe tip along an/the auxiliary surface normal direction of the auxiliary surface;
(iii) moving the probe tip along a/the Z-actuation axis of the positioning structure;
(iv) moving the auxiliary surface away from the probe tip;
(v) moving the auxiliary surface along the auxiliary surface normal direction; and
(vi) moving the auxiliary surface along the Z-actuation axis of the positioning structure.

A22. The method of any of paragraphs A20-A21, wherein the separating the probe tip from the auxiliary surface includes establishing a probe tip-auxiliary surface separation distance of at least one of:
(i) at least 2 micrometers, at least 4 micrometers, at least 6 micrometers, at least 8 micrometers, at least 10 micrometers, at least 15 micrometers, at least 20 micrometers, at least 30 micrometers, at least 40 micrometers, or at least 50 micrometers; and
(ii) at most 100 micrometers, at most 80 micrometers, at most 60 micrometers, at most 40 micrometers, or at most 20 micrometers.

A23. The method of any of paragraphs A1-A22, wherein, subsequent to the moving the probe tip to the DUT contact height, the method further includes separating the probe tip from the DUT surface.

A24. The method of paragraph A23, wherein the separating the probe tip from the DUT surface includes at least one of:
(i) moving the probe tip away from the DUT surface;
(ii) moving the probe tip along an/the DUT surface normal direction of the DUT surface;
(iii) moving the probe tip along a/the Z-actuation axis of the positioning structure;
(iv) moving the DUT surface away from the probe tip;
(v) moving the DUT surface along the DUT surface normal direction; and
(vi) moving the auxiliary surface along the Z-actuation axis of the positioning structure.

A25. The method of any of paragraphs A23-A24, wherein the separating the probe tip from the DUT surface includes establishing a probe tip-DUT surface separation distance of at least one of:
(i) at least 2 micrometers, at least 4 micrometers, at least 6 micrometers, at least 8 micrometers, at least 10 micrometers, at least 15 micrometers, at least 20 micrometers, at least 30 micrometers, at least 40 micrometers, or at least 50 micrometers; and (ii) at most 100 micrometers, at most 80 micrometers, at most 60 micrometers, at most 40 micrometers, or at most 20 micrometers.

A26. The method of any of paragraphs A1-A25, wherein, subsequent to the moving the probe tip to the DUT contact height and during contact between the probe tip and the DUT surface, the method further includes electrically testing the DUT.

A27. The method of paragraph A26, wherein the electrically testing the DUT includes at least one of:
  (i) providing an electric test signal to the DUT via the probe tip; and
  (ii) receiving an electric resultant signal from the DUT via the probe tip.

A28. The method of any of paragraphs A1-A27, wherein the substrate includes a plurality of DUTs.

A29. The method of paragraph A28, wherein the method further includes:
  (i) repeating the measuring the height differential for each DUT in a contacted subset of the plurality of DUTs to determine a corresponding height differential for each DUT in the contacted subset;
  (ii) repeating the determining the DUT contact height for each DUT in the contacted subset to determine a corresponding DUT contact height for each DUT in the contacted subset; and
  (iii) sequentially repeating the aligning the probe tip and the DUT for contact with one another for each DUT in the contacted subset and the moving the probe tip to the corresponding DUT contact height for each DUT in the contacted subset to physically contact the probe tip with a corresponding DUT surface of each DUT in the contacted subset.

A30. The method of any of paragraphs A28-A29, wherein the method further includes repeating the aligning the probe tip and the DUT for contact with one another and the moving the probe tip to the DUT contact height for each DUT in a contacted subset of the plurality of DUTs.

A31. The method of any of paragraphs A1-A30, wherein the method includes physically contacting the probe tip with the DUT without utilizing an image of the probe.

B. A probe system, comprising at least one of:
  a chuck assembly that includes:
    (i) a primary chuck that defines a support surface configured to support a substrate that includes a device under test (DUT); and
    (ii) an auxiliary chuck that defines an auxiliary surface;
  a probe that defines a probe tip configured to physically contact the DUT surface;
  a signal generation and analysis assembly configured to at least one of supply a test signal to the DUT and receive a resultant signal from the DUT;
  a positioning structure configured to selectively vary a relative orientation between the probe tip and the chuck assembly;
  a vision system configured to collect an optical image of at least a region of the probe system; and
  a controller programmed to control the operation of the probe system according to the method of any of paragraphs A1-A31.

C. Non-transitory computer readable storage media including computer-executable instructions that, when executed, direct a probe system to perform the method of any of paragraphs A1-A31.

INDUSTRIAL APPLICABILITY

The methods, probe systems, and storage media disclosed herein are applicable to the semiconductor manufacturing and test industries.

It is believed that the disclosure set forth above encompasses multiple distinct inventions with independent utility. While each of these inventions has been disclosed in its preferred form, the specific embodiments thereof as disclosed and illustrated herein are not to be considered in a limiting sense as numerous variations are possible. The subject matter of the inventions includes all novel and non-obvious combinations and subcombinations of the various elements, features, functions and/or properties disclosed herein. Similarly, where the claims recite "a" or "a first" element or the equivalent thereof, such claims should be understood to include incorporation of one or more such elements, neither requiring nor excluding two or more such elements.

It is believed that the following claims particularly point out certain combinations and subcombinations that are directed to one of the disclosed inventions and are novel and non-obvious. Inventions embodied in other combinations and subcombinations of features, functions, elements and/or properties may be claimed through amendment of the present claims or presentation of new claims in this or a related application. Such amended or new claims, whether they are directed to a different invention or directed to the same invention, whether different, broader, narrower, or equal in scope to the original claims, are also regarded as included within the subject matter of the inventions of the present disclosure.

The invention claimed is:

1. A method of establishing contact between a probe tip of a probe system and a device under test (DUT), wherein the DUT is formed on a substrate that is supported by a support surface of a primary chuck of the probe system, the method comprising:
  measuring a height differential between a DUT surface of the DUT and an auxiliary surface of an auxiliary chuck;
  aligning the probe tip and the auxiliary chuck for contact with one another utilizing a positioning structure of the probe system;
  physically contacting the probe tip with the auxiliary surface of the auxiliary chuck, utilizing the positioning structure, to determine an auxiliary contact height between the probe tip and the auxiliary surface;
  determining a DUT contact height between the probe tip and the DUT surface, wherein the DUT contact height is based, at least in part, on the height differential and the auxiliary contact height;
  aligning the probe tip and the DUT for contact with one another utilizing the positioning structure; and
  moving the probe tip to the DUT contact height, utilizing the positioning structure, to physically contact the probe tip with the DUT surface.

2. The method of claim 1, wherein the measuring the height differential includes measuring a height of the DUT surface and a height of the auxiliary surface.

3. The method of claim 1, wherein the measuring the height differential includes:
  (i) focusing a vision system of the probe system on the DUT surface to determine a DUT surface focal position of the vision system; and
  (ii) focusing the vision system on the auxiliary surface to determine an auxiliary surface focal position of the vision system;
  wherein the measuring the height differential further includes at least one of:
  (i) calculating the height differential based, at least in part, on the DUT surface focal position and the auxiliary surface focal position; and (ii) calculating the height differential from a linear combination of the DUT surface focal position and the auxiliary surface focal position.

4. The method of claim 1, wherein the measuring the height differential includes measuring the height differential at least one of:
   (i) along a DUT surface normal direction of the DUT surface;
   (ii) along an auxiliary surface normal direction of the auxiliary surface; and
   (iii) along a Z-actuation axis of the positioning structure.

5. The method of claim 1, wherein the physically contacting includes detecting contact between the probe tip and the auxiliary surface.

6. The method of claim 5, wherein the detecting contact includes at least one of:
   (i) detecting electrical continuity between the probe tip and the auxiliary surface;
   (ii) detecting a probe contact force exerted on the auxiliary surface by the probe tip; and
   (iii) detecting a surface contact force exerted on the probe tip by the auxiliary surface.

7. The method of claim 1, wherein the auxiliary contact height includes an orientation of the positioning structure, along a Z-actuation axis of the positioning structure, at which the probe tip initially establishes contact with the auxiliary surface.

8. The method of claim 7, wherein the determining the DUT contact height includes calculating a relative height, along the Z-actuation axis of the positioning structure, at which the probe tip contacts the DUT surface during the moving the probe tip to the DUT contact height.

9. The method of claim 8, wherein the determining the DUT contact height includes at least one of:
   (i) calculating the DUT contact height based, at least in part, on the height differential and the auxiliary contact height; and
   (ii) calculating the DUT contact height from a linear combination of the height differential and the auxiliary contact height.

10. The method of claim 1, wherein the determining the DUT contact height includes adjusting the auxiliary contact height based upon the height differential.

11. The method of claim 1, wherein, subsequent to the moving the probe tip to the DUT contact height, the probe tip exhibits less than a threshold overtravel magnitude, wherein the threshold overtravel magnitude is less than 10 micrometers.

12. The method of claim 1, wherein, subsequent to the physically contacting the probe tip with the auxiliary surface and prior to the aligning the probe tip and the DUT for contact with one another, the method further includes separating the probe tip from the auxiliary surface.

13. The method of claim 1, wherein, subsequent to the moving the probe tip to the DUT contact height, the method further includes separating the probe tip from the DUT surface.

14. The method of claim 1, wherein, subsequent to the moving the probe tip to the DUT contact height and during contact between the probe tip and the DUT surface, the method further includes electrically testing the DUT.

15. The method of claim 14, wherein the electrically testing the DUT includes at least one of:
   (i) providing an electric test signal to the DUT via the probe tip; and
   (ii) receiving an electric resultant signal from the DUT via the probe tip.

16. The method of claim 1, wherein the substrate includes a plurality of DUTs, and further wherein the method includes:
   (i) repeating the measuring the height differential for each DUT in a contacted subset of the plurality of DUTs to determine a corresponding height differential for each DUT in the contacted subset;
   (ii) repeating the determining the DUT contact height for each DUT in the contacted subset to determine a corresponding DUT contact height for each DUT in the contacted subset; and
   (iii) sequentially repeating the aligning the probe tip and the DUT for contact with one another for each DUT in the contacted subset and the moving the probe tip to the corresponding DUT contact height for each DUT in the contacted subset to physically contact the probe tip with a corresponding DUT surface of each DUT in the contacted subset.

17. The method of claim 16, wherein the method further includes repeating the aligning the probe tip and the DUT for contact with one another and the moving the probe tip to the DUT contact height for each DUT in a contacted subset of the plurality of DUTs.

18. The method of claim 1, wherein the method includes physically contacting the probe tip with the DUT without utilizing an image of the probe.

19. A probe system, comprising at least one of:
   a chuck assembly that includes:
   (i) a primary chuck that defines a support surface configured to support a substrate that includes a device under test (DUT); and
   (ii) an auxiliary chuck that defines an auxiliary surface;
   a probe that defines a probe tip configured to physically contact a DUT surface;
   a signal generation and analysis assembly configured to at least one of supply a test signal to the DUT and receive a resultant signal from the DUT;
   a positioning structure configured to selectively vary a relative orientation between the probe tip and the chuck assembly;
   a vision system configured to collect an optical image of at least a region of the probe system; and
   a controller programmed to control the operation of the probe system according to the method of claim 1.

20. Non-transitory computer readable storage media including computer-executable instructions that, when executed, direct a probe system to perform the method of claim 1.

* * * * *